United States Patent
Zhang

(10) Patent No.: US 8,384,390 B2
(45) Date of Patent: Feb. 26, 2013

(54) SYSTEMS AND METHODS FOR DETERMINING BATTERY CAPACITY LEVEL

(75) Inventor: Wei Zhang, Shanghai (CN)

(73) Assignee: O2Micro Inc, Santa Clara, CA (US)

( * ) Notice: Subject to any disclaimer, the term of this patent is extended or adjusted under 35 U.S.C. 154(b) by 722 days.

(21) Appl. No.: 12/570,148

(22) Filed: Sep. 30, 2009

(65) Prior Publication Data

US 2011/0074433 A1    Mar. 31, 2011

(51) Int. Cl.
    *G01N 27/416*      (2006.01)
    *H02J 7/00*      (2006.01)

(52) U.S. Cl. ............... 324/429; 320/152; 320/118

(58) Field of Classification Search ............... None
See application file for complete search history.

(56) References Cited

U.S. PATENT DOCUMENTS

| | | | |
|---|---|---|---|
| 5,504,415 A * | 4/1996 | Podrazhansky et al. | 320/118 |
| 5,666,040 A * | 9/1997 | Bourbeau | 320/118 |
| 5,900,718 A * | 5/1999 | Tsenter | 320/151 |
| 5,952,815 A * | 9/1999 | Rouillard et al. | 320/116 |
| 2006/0279289 A1 * | 12/2006 | Denning | 324/427 |
| 2007/0194754 A1 * | 8/2007 | Fukuzawa et al. | 320/112 |
| 2008/0239628 A1 * | 10/2008 | Tatebayashi et al. | 361/434 |

FOREIGN PATENT DOCUMENTS

| | | |
|---|---|---|
| CN | 101303397 A | 11/2008 |
| CN | 101312293 A | 11/2008 |

* cited by examiner

*Primary Examiner* — Jay Patidar

(57) ABSTRACT

A battery gas gauge includes a voltage detection unit and a processor. The voltage detection unit is coupled to a battery pack and can measure a plurality of open circuit voltages of a plurality of cells in the battery pack respectively. The processor is coupled to the voltage detection unit and can determine a minimum open circuit voltage of the open circuit voltages, and can determine a first relative state of charge of the battery pack based on a relationship between the minimum open circuit voltage and a corresponding relative state of charge of a cell having the minimum open circuit voltage. The processor can further determine a capacity level of the battery pack based on the first relative state of charge and a rated full capacity level of the battery pack.

19 Claims, 4 Drawing Sheets

SYSTEMS AND METHODS FOR DETERMINING BATTERY CAPACITY LEVEL

BACKGROUND

A variety of electronic devices such as laptop computers, personal digital assistants, cell phones, etc., may be powered by a battery pack. The battery pack may include multiple rechargeable battery cells connected in series. The battery pack may be recharged when a suitable DC power source, e.g., an AC/DC adapter, is coupled to the electronic device. The electronic device may include a battery gas gauge to calculate a remaining capacity in the battery pack such that a user can decide when to recharge the battery pack.

FIG. 1 shows a block diagram of a conventional battery gas gauge 100. In the example of FIG. 1, the battery pack includes two series-connected cells, the cell 102-1 and the cell 102-2. The battery gas gauge 100 includes an analog-to-digital converter (ADC) 108 coupled to the cell 102-1 and the cell 102-2 through a voltage divider 106 for measuring an open circuit voltage (OCV) of the battery pack. An open circuit voltage of a battery pack refers to a voltage across the battery pack when the battery pack is disconnected (neither charging nor discharging). The open circuit voltage of the battery pack can be measured after the battery pack is disconnected for a time period long enough such that the voltage across the battery pack becomes relatively stable.

The measured open circuit voltage Vbat of the battery pack is stored in a register 110. A processor 112 reads Vbat from the register 110 and determines a relative state of charge (RSOC) based on a predetermined OCV table 114. More specifically, the processor 112 divides Vbat by the total number of cells in the battery pack to obtain an average cell voltage, and looks up the OCV table 114 to determine a relative state of charge of the battery pack.

The OCV table 114 is a lookup table that can indicate a relationship between the average cell voltage and corresponding ROSCs. Table 1 shows an example of an OCV table. A set of relative state of charges corresponding to a set of average cell voltages are stored in the OCV table in advance.

TABLE 1

| RSOC(%) | 100 | 95 | 90 | 85 | 80 | 75 | 70 | 65 | 60 | 55 |
|---|---|---|---|---|---|---|---|---|---|---|
| OCV(mV) | 4160 | 4100 | 4062 | 4036 | 4005 | 3965 | 3922 | 3883 | 3848 | 3814 |
| RSOC(%) | 50 | 45 | 40 | 35 | 30 | 25 | 20 | 15 | 10 | 5 |
| OCV(mV) | 3773 | 3734 | 3695 | 3660 | 3623 | 3588 | 3557 | 3520 | 3485 | 3374 |

For example, if the open circuit voltage Vbat of the battery pack is 7.4V, the processor 112 can calculate an average cell voltage equal to 3.7V. In the OCV table, an open circuit voltage of 3695 mv corresponds to a relative state of charge of 40%. Therefore, the processor 112 determines that the battery pack has a relative state of charge around 40%. If the battery pack has a rated full capacity level of 1000 mAh, the remaining capacity of the battery pack is determined to be around 400 mAh.

Therefore, in the conventional battery gas gauge 100, an average cell voltage is used to determine a relative state of charge of the battery pack. However, charging and discharging of the battery pack through normal operation over time may result in cell-to-cell variations in cell voltages. When one or more cells in a series string charge faster or slower than the others, an unbalanced condition may occur. Thus, cell voltages of the cells in the battery pack may be different. For example, when Vbat is 7.4V, the voltage of the cell 102-1 can be 3.623V, and the voltage of the cell 102-2 can be 3.777V. When the battery pack discharges, cell voltages of the cell 102-1 and the cell 102-2 both decrease. The battery pack may be prevented from discharging if any cell voltage decreases to a protection threshold, e.g., 3V. Since the cell 102-1 has a cell voltage lower than the cell 102-2, the battery pack will be prevented from discharging if voltage of the cell 102-1 decreases to 3V. However, at this time, the cell 102-2 may have a voltage higher than 3V. In other words, there is some capacity of the cell 102-2 that is not utilized, which can result in a difference between an actual full capacity level of the battery pack and the rated full capacity level of the battery pack. Thus, the accuracy of the remaining capacity of the battery pack measured by the conventional battery gas gauge 100 may be reduced.

SUMMARY

A battery gas gauge includes a voltage detection unit and a processor. The voltage detection unit is coupled to a battery pack and can measure a plurality of open circuit voltages of a plurality of cells in the battery pack respectively. The processor is coupled to the voltage detection unit and can determine a minimum open circuit voltage of the open circuit voltages, and can determine a first relative state of charge of the battery pack based on a relationship between the minimum open circuit voltage and a corresponding relative state of charge of a cell having the minimum open circuit voltage.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Embodiments in accordance with the present invention provide a battery gas gauge. The battery gas gauge monitors an open circuit voltage of each individual cell in a battery pack and calculates a remaining capacity level of the battery pack according to a minimum open circuit voltage of the cells, in one embodiment. Advantageously, the remaining capacity level can be more accurate compared to the conventional battery gas gauge circuit 100. Moreover, the battery gas gauge in the present invention can calculate a relatively accurate full capacity level of the battery pack based on an average open circuit voltage of the cells and the remaining capacity level.

Figure 1:
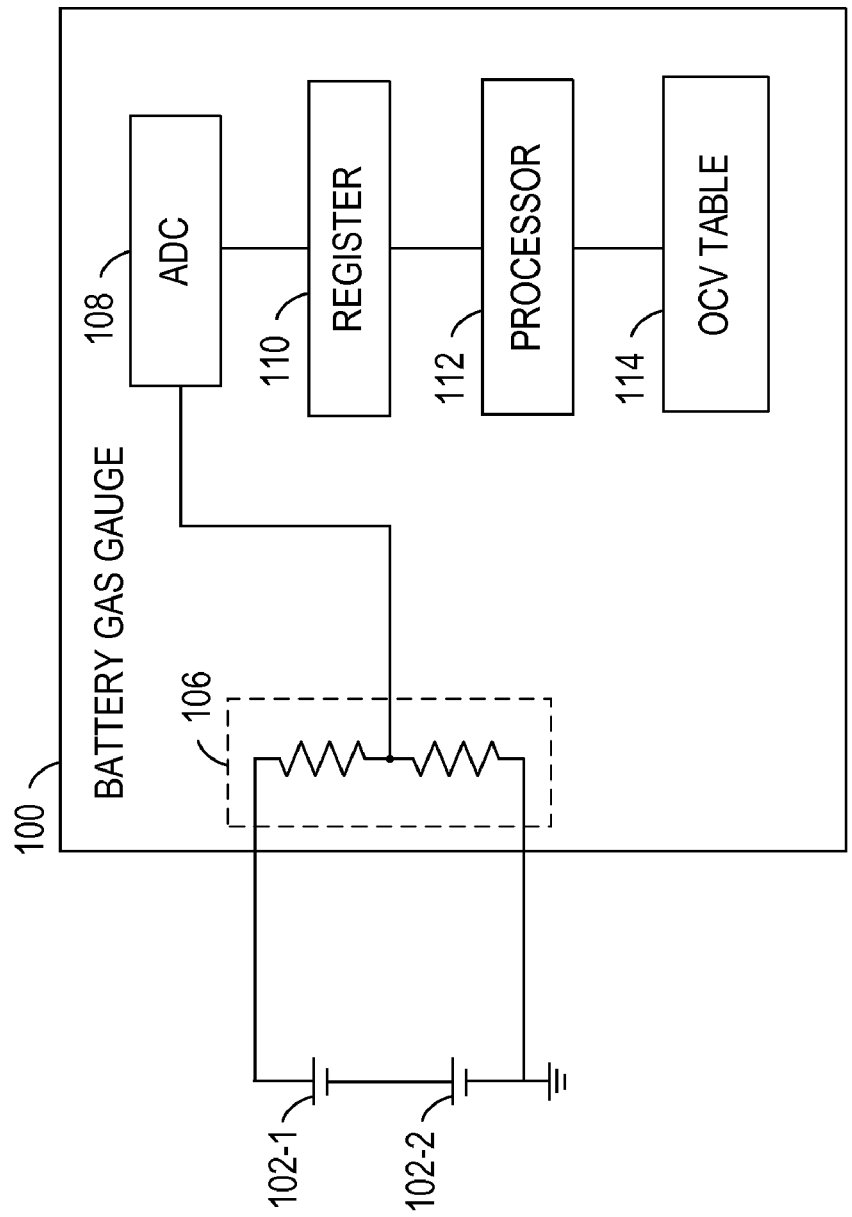
FIG. 1 shows a block diagram of a conventional battery gas gauge.
Figure 2:
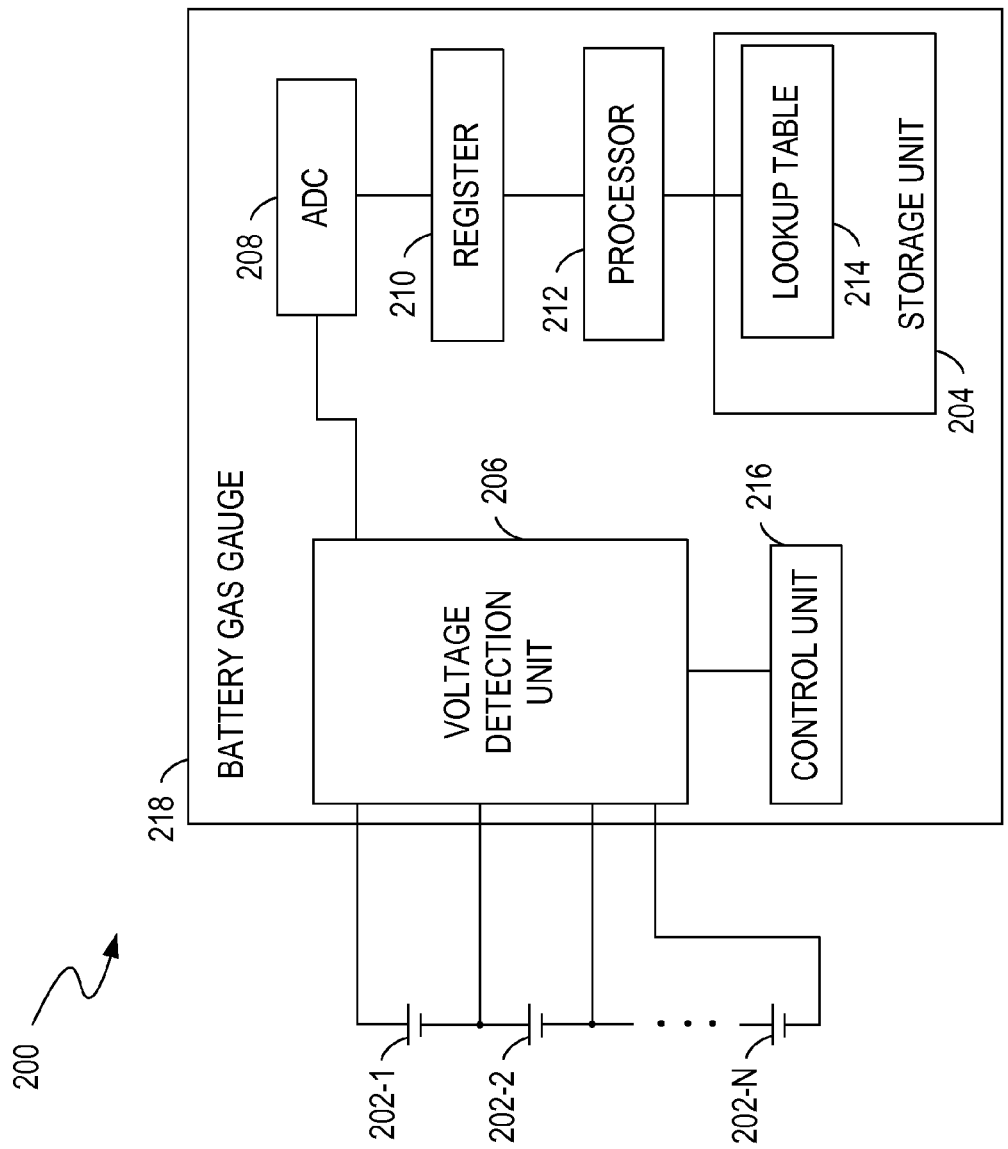
FIG. 2 shows a block diagram of a battery pack including a battery gas gauge, in accordance with one embodiment of the present invention.

FIG. 2 shows a block diagram of a battery pack 200 including a battery gas gauge 218, in accordance with one embodiment of the present invention. In the example of FIG. 2, the battery pack 200 includes cells 202-1, 202-2, . . . 202-N connected in series.

In one embodiment, the battery gas gauge 218 can include a voltage detection unit 206, an analog-to-digital converter (ADC) 208, a register 210, and a processor 212. The voltage detection unit 206 coupled to each individual cell 202-1, 202-2, . . . 202-N measures an open circuit voltage of each individual cell 202-1, 202-2, . . . 202-N under control of a control unit 216. The open circuit voltage of a cell refers to a voltage difference between two terminals of the cell when the battery pack is disconnected (neither charging nor discharging; no current flows through the battery pack). In one embodiment, the open cell voltages of the individual cells 202-1, 202-2, . . . 202-N are measured by the voltage detection unit 206 after the battery pack has been disconnected for a time period long enough (e.g., 3-4 hours) such that the voltage across each individual cell 202-1, 202-2, . . . 202-N becomes relatively stable.

The analog-to-digital converter (ADC) 208 coupled to the voltage detection circuit 206 converts the measured open circuit voltages of the cells 202-1, 202-2, . . . 202-N into digital data. The register 210 coupled to the ADC 208 stores digitized open circuit voltages of the cells 202-1, 202-2, . . . 202-N. The processor 212 can determine a remaining capacity level of the battery pack 200 based on the open circuit voltages of the cells 202-1, 202-2, . . . 202-N according to a predetermined lookup table 214. In one embodiment, the lookup table 214 can be stored in a storage unit 204 which is coupled to the processor 212. The lookup table 214 can indicate a relationship between different open circuit voltages of a cell and corresponding relative state of charges (RSOCs) of the cell. Each of the cells 202-1, 202-2, . . . 202-N in the battery pack 200 can share a common lookup table 214.

In operation, the processor 212 can read respective open circuit voltages of the individual cells 202-1, 202-2, . . . 202-N from the register 210, and can determine a minimum open circuit voltage $V_{CELL-MIN}$ of the open circuit voltages. For example, if N=2 and the open circuit voltages for the cells are 3.81V and 3.96V respectively, the processor 212 can determine that the minimum open circuit voltage $V_{CELL-MIN}$ is 3.81V. The processor 212 can determine a relative state of charge of the battery pack 200 based on the minimum open circuit voltage $V_{CELL-MIN}$ according to the lookup table 214. An example of the lookup table 214 is shown in Table 2. In Table 2, an open circuit voltage of $V_1$ corresponds to a relative state of charge of 5%. An open circuit voltage of $V_2$ corresponds to a relative state of charge of 10%, etc.

TABLE 2

| RSOC(%) | 100 | 95 | ... | 70 | ... | 55 | ... | 15 | 10 | 5 |
|---|---|---|---|---|---|---|---|---|---|---|
| OCV(mV) | $V_7$ | $V_6$ | ... | $V_5$ | ... | $V_4$ | ... | $V_3$ | $V_2$ | $V_1$ |

For example, if the minimum open circuit voltage $V_{CELL-MIN}$ is 3.81V, the processor 212 can look up the lookup table 214 to determine a first relative state of charge RSOC1 of the battery pack 200 according to a corresponding relative state of charge of a cell having an open circuit voltage of 3.81V. Assume that $V_4$ in the lookup table 214 is 3.81V. According to the lookup table, a cell having an open circuit voltage of 3.81V has a relative state of charge of 55%. Thus, the processor 212 can determine that a first relative state of charge RSOC1 of the battery pack is approximately 55%. The processor 212 can look up the lookup table 214 to find an open circuit voltage which is closest to the minimum open circuit voltage and determine the first relative state of charge RSOC1 of the battery pack accordingly. In other words, the lookup table 214 stores different relative state of charges of the battery pack corresponding to different levels of the minimum open circuit voltage of the cells.

When a battery pack is manufactured, a rated full capacity level $C_{RATED}$ can be determined. For example, the battery pack 200 in FIG. 2 can have a rated full capacity level $C_{RATED}$ of 1000 mAh. In one embodiment, the processor 212 can further determine a remaining capacity level $C_{REMAIN}$ of the battery pack 200 based on the first relative state of charge RSOC1 and the rated full capacity level $C_{RATED}$. The remaining capacity level $C_{REMAIN}$ can be given by:

$$C_{REMAIN} = C_{RATED} * RSOC1 \quad (1)$$

In the above example, the first relative state of charge RSOC1 is 55%, the rated full capacity level $C_{RATED}$ is 1000 mAh, and therefore the processor 212 can determine that the remaining capacity level $C_{REMAIN}$ of the battery pack 200 is 550 mAh.

Due to the unbalance of the cell voltages, the actual full capacity level of the battery pack 200 may be different from the rated full capacity level. As used herein, "actual full capacity level" means the total charge that a fully charged battery pack can be discharged until a cell voltage of a cell drops to a predetermined protection threshold. In one embodiment, the processor 212 can further determine an estimated full capacity level $C_{EST}$ of the battery pack 200. Advantageously, a difference between the estimated full capacity level $C_{EST}$ and the actual full capacity level can be smaller than a difference between the rated full capacity level $C_{RATED}$ and the actual full capacity level.

In one embodiment, the processor 212 can determine an average open circuit voltage $V_{CELL-AVG}$ of the cells 202-1, 202-2, . . . 202-N, and then determine a second relative state of charge RSOC2 of the battery pack 200 based on the lookup table 214 and the average open circuit voltage $V_{CELL-AVG}$ of the cells 202-1, 202-2, . . . 202-N. Afterwards, the processor 212 can determine an estimated full capacity level $C_{EST}$ of the battery pack 200 based on the second relative state of charge RSOC2 and the remaining capacity level $C_{REMAIN}$.

More specifically, the voltage detection unit 206 can measure an open circuit voltage of the battery pack 200, in one embodiment. The measured open circuit voltage of the battery pack 200 can be converted to digital data by the ADC 208, and is stored in the register 210. In another embodiment, the open circuit voltage of the battery pack 200 can also be obtained by adding up the open circuit voltages of all the individual cells 202-1, 202-2, . . . 202-N. The processor 212 can determine an average open circuit voltage $V_{CELL-AVG}$ of the cells by dividing the open circuit voltage of the battery pack 200 by the total number of the cells 202-1, 202-2, . . . 202-N, that is, by the number N. The processor 212 can look up the lookup table 214 to determine a second relative state of charge RSOC2 of the battery pack 200 based on the average open circuit voltage $V_{CELL-AVG}$ of the cells. After the second relative state of charge RSOC2 is determined, the processor 212 can calculate an estimated full capacity level $C_{EST}$ of the battery pack 200 by dividing the remaining capacity level $C_{REMAIN}$ of the battery pack 200 by the second relative state of charge RSOC2. That is, the estimated full capacity level $C_{EST}$ can be given by:

$$C_{EST} = C_{REMAIN}/\text{RSOC2} \quad (2)$$

For example, if the battery pack 200 includes two cells 202-1 and 202-2 (N=2) and an open circuit voltage of the battery pack 200 is 7.84V, an average open circuit voltage $V_{CELL-AVG}$ of the cells 202-1 and 202-2 can be determined to be 3.92V. In the lookup table 214 (Table 2), if the value of an open circuit voltage $V_5$ is 3.92V and $V_5$ corresponds to a relative state of charge of 70%, the processor 212 can determine a second relative state of charge RSOC2 of the battery pack 200 is approximately 70%. The processor 212 can look up the lookup table 214 to find an open circuit voltage which is closest to the average open circuit voltage $V_{CELL-AVG}$ and determine the second relative state of charge RSOC2 of the battery pack 200 accordingly. As described above, a remaining capacity level $C_{REMAIN}$ of the battery pack 200 is 550 mAh. Thus, the processor 212 can determine an estimated full capacity level $C_{EST}$ of the battery pack 200 by dividing the remaining capacity level $C_{REMAIN}$ (550 mAh) by the second relative state of charge RSOC2 (70%), that is, about 785.7 mAh.

During battery discharging or charging, the open circuit voltages of the cells 202-1, 202-2, . . . 202-N may not be directly measured. Therefore, a relative state of charge may not be directly obtained based on the lookup table 214. In one embodiment, the estimated full capacity level $C_{EST}$ can be used to determine a third relative state of charge RSOC3 of the battery pack 200 under such circumstance. When the battery pack is charged or discharged, charge flowing into or out of the battery pack or battery cell can be measured by a Coulomb counting circuit (not shown in FIG. 2). If the battery pack is charged, the charge accumulated in the battery pack during charging can be calculated, e.g., by a Coulomb counting circuit. Thus, the current remaining capacity level $C_{REMAIN-END1}$ at the end of charging can be obtained by summing the remaining capacity level $C_{REMAIN}$ before charging and the accumulated charge $C_{CHG}$ in the battery pack during charging. That is, the current remaining capacity level $C_{REMAIN-END1}$ at the end of charging can be given by:

$$C_{REMAIN-END1} = C_{REMAIN} + C_{CHG} \quad (3)$$

The processor 212 can determine a third relative state of charge RSOC3 (the relative state of charge at the end of charging) of the battery pack by dividing the current remaining capacity level $C_{REMAIN-END1}$ by the estimated full capacity level $C_{EST}$. That is, the third relative state of charge RSOC3 of the battery pack can be given by:

$$\text{RSOC3} = C_{REMAIN-END1}/C_{EST} \quad (4)$$

For example, the remaining capacity level $C_{REMAIN}$, as previously determined, is 550 mAh. If the accumulated charge $C_{CHG}$ in the battery pack during charging is 50 mAh, the current remaining capacity level at the end of charging $C_{REMAIN-END1}$ is 600 mAh. Thus, a third relative state of charge of the battery pack 200 can be determined by dividing the current remaining capacity level (600 mAh) by the estimated full capacity level (785.7 mAh), that is, 76%.

Similarly, if the battery pack is discharged, the charge consumed by the battery pack during discharging can be calculated, e.g., by a Coulomb counting circuit. Thus, the current remaining capacity $C_{REMAIN-END2}$ at the end of discharging can be obtained by subtracting the consumed charge $C_{DCHG}$ by the battery pack during discharging from the remaining capacity level $C_{REMAIN}$ before discharging.

$$C_{REMAIN-END2} = C_{REMAIN} - C_{DCHG} \quad (5)$$

The processor 212 can determine a third relative state of charge RSOC3 (the relative state of charge at the end of discharging) of the battery pack 200 by dividing the current remaining capacity level $C_{REMAIN-END2}$ by the estimated full capacity level $C_{EST}$.

$$\text{RSOC3} = C_{REMAIN-END2}/C_{EST} \quad (6)$$

In the example of FIG. 2, the battery gas gauge 218 is integrated in the battery pack 200. However, in another embodiment, the battery gas gauge 218 can also be implemented outside the battery pack 200.

Figure 3:
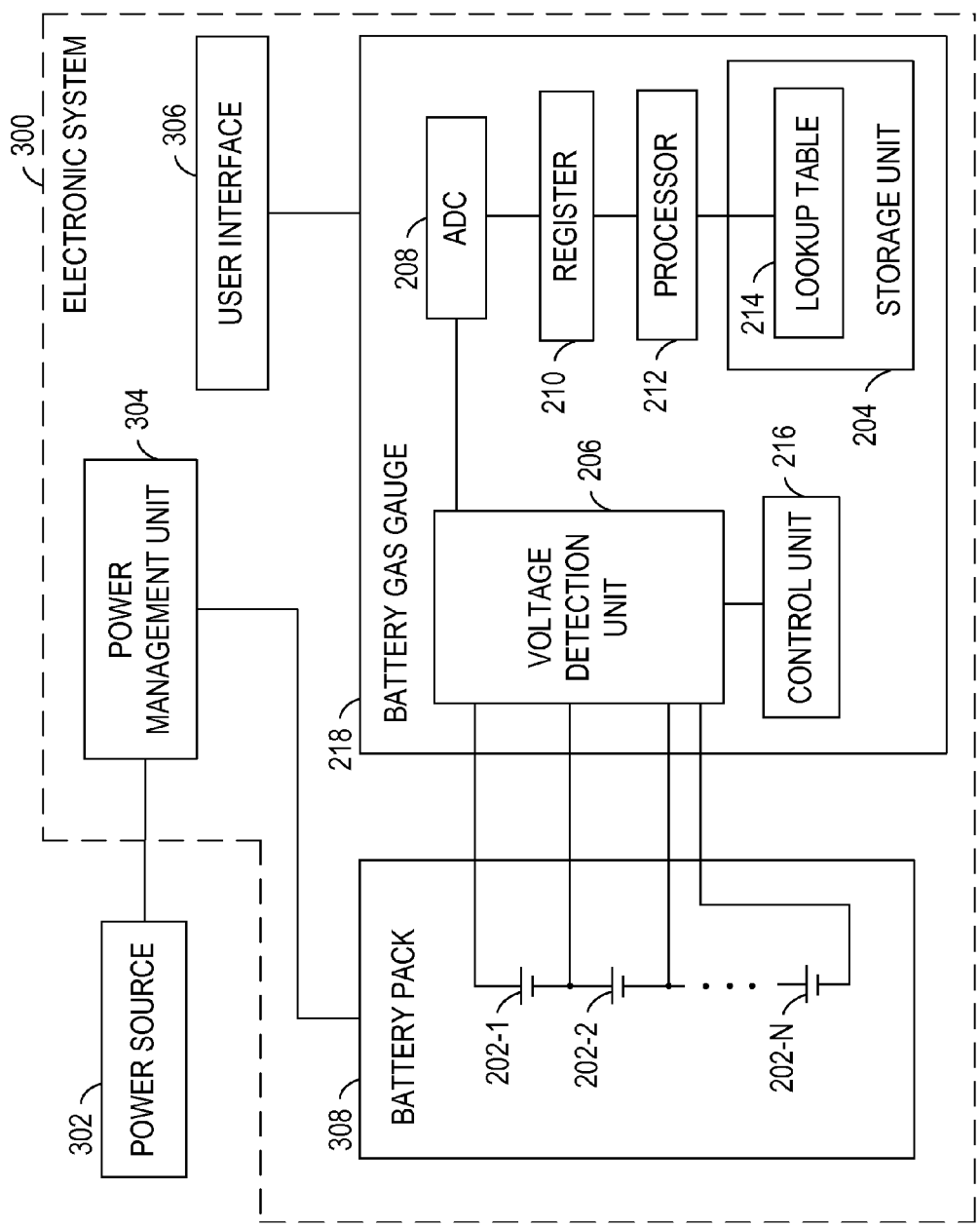
FIG. 3 shows a block diagram of an electronic system including a battery gas gauge, in accordance with one embodiment of the present invention.

FIG. 3 shows a block diagram of an electronic system 300 including a battery gas gauge 218, in accordance with one embodiment of the present invention. Elements labeled the same as in FIG. 2 have similar functions.

In one embodiment, the electronic system 300 can include a power management unit 304 coupled between a power source 302 and a battery pack 308. The power source 302 can be an AC/DC converter which can receive AC power from a wall outlet and convert the AC power to DC power. The battery pack 308 can include a plurality of cells 202-1, 202-2, . . . 202-N coupled in series. The electronic system 300 further includes a battery gas gauge 218 coupled to the battery pack 308 and a user interface 306. The electronic system 300 can also include other components to perform various functions.

In operation, the power management unit 304 can monitor and control the power from the power source 302, and direct the power from the power source 302 to various components in the electronic system 300 and/or to charge the battery pack 308. The power management unit 304 can also monitor and control power from the battery pack 308, and direct the power from the battery pack 308 to various components in the electronic system 300. The battery gas gauge 218 can measure an open circuit voltage of each of the cells 202-1, 202-2, . . . 202-N by a voltage detection unit 206. A processor 212 can determine a minimum open circuit voltage $V_{CELL-MIN}$ of the cells 202-1, 202-2, . . . 202-N. Afterwards, the processor 212 can determine a first relative state of charge RSOC1 of the battery pack 308 based on the minimum open circuit voltage $V_{CELL-MIN}$ and a predetermined lookup table 214 which is stored in a storage unit 204. According to the first relative state of charge RSOC1 and a rated full capacity level $C_{RATED}$ of the battery pack 308, the processor 212 can determine a remaining capacity level $C_{REMAIN}$ of the battery pack 308. Based on an average open circuit voltage $V_{CELL-AVG}$ of the cells 202-1, 202-2, . . . 202-N and the lookup table 214, the processor 212 can determine a second relative state of charge RSOC2 of the battery pack 308. According to the second relative state of charge RSOC2 and the remaining capacity level $C_{REMAIN}$, the processor 212 can determine an estimated full capacity level $C_{EST}$ of the battery pack 308. The estimated full capacity level $C_{EST}$ can be used by the processor 212 to determine a third relative state of charge RSOC3 of the battery pack 308 at the end of a charging/discharging process.

The user interface 306 can include a video display device or an audio output device to inform a user about the power status of the electronic system 300. The power status of the electronic system 300 can include information such as the relative state of charges and remaining capacity levels of the battery pack 308 which are determined by the processor 212.

Figure 4:
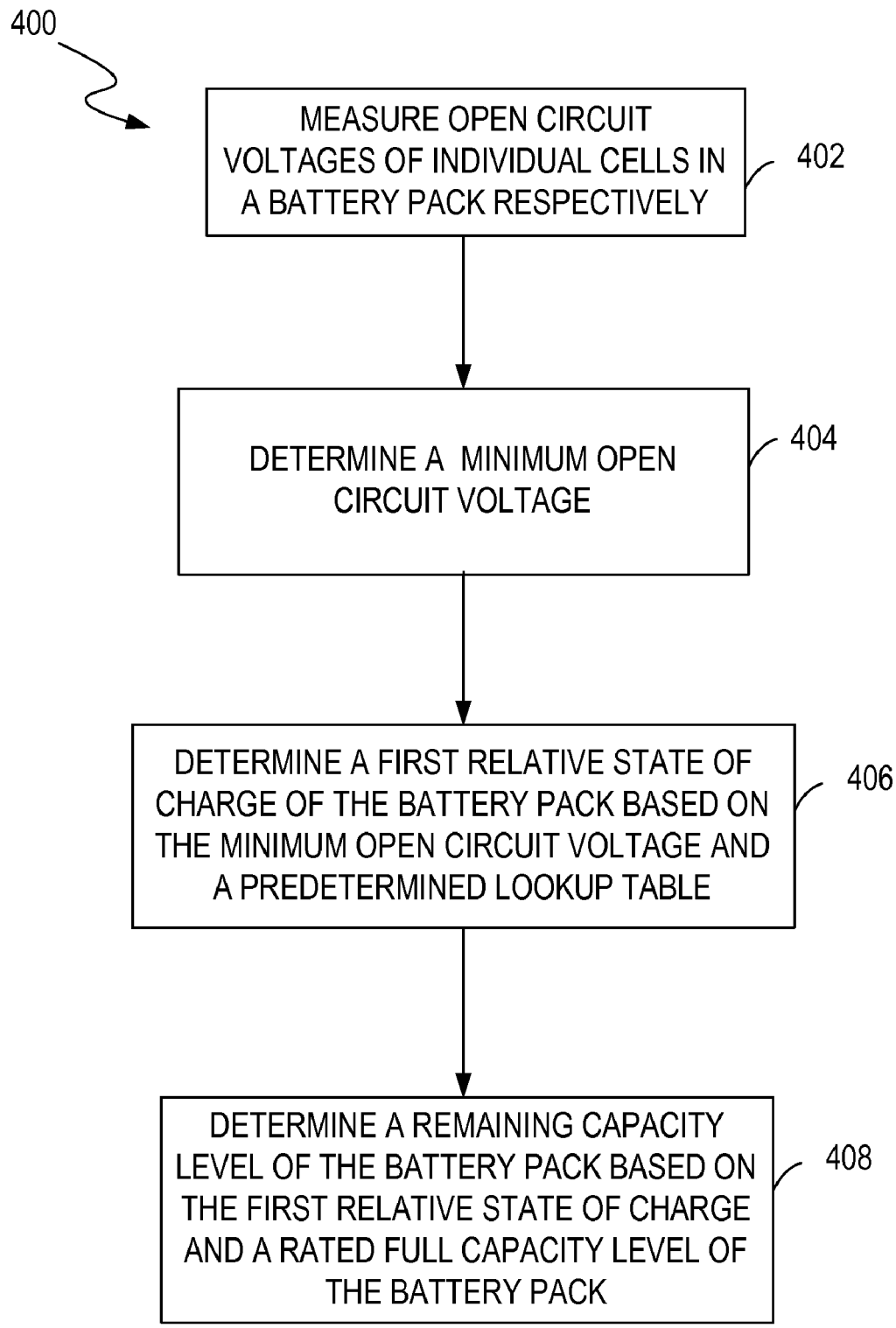
FIG. 4 shows a flowchart of a method for determining a capacity level of a battery pack, in accordance with one embodiment of the present invention.

FIG. 4 shows a flowchart 400 of a method for determining a capacity level of a battery pack, in accordance with one embodiment of the present invention. FIG. 4 is described in combination with FIG. 2 and FIG. 3.

In block 402, open circuit voltages of individual cells in a battery pack are measured respectively, e.g., by a voltage detection unit 206.

In block 404, a minimum open circuit voltage of the measured open circuit voltages is determined, e.g., by a processor 212.

In block 406, a first relative state of charge of the battery pack is determined based on the minimum open circuit voltage and a predetermined lookup table. The lookup table can indicate a relationship between the minimum open circuit voltage and a corresponding relative state of charge of a cell having the minimum open circuit voltage.

In block 408, a remaining capacity level of the battery pack is determined based on the first relative state of charge and a rated full capacity level of the battery pack.

Accordingly, embodiments in accordance with the present invention provide a battery gas gauge. The battery gas gauge can determine a remaining capacity level of a battery pack based on a minimum open circuit voltage of a plurality of cells in the battery pack. Advantageously, compared with the conventional method, the remaining capacity level determined according to present invention can be more accurate if the cell voltages are unbalanced.

Furthermore, the battery gas gauge can determine an estimated full capacity level of the battery pack based on an average open circuit voltage of the cells and the remaining capacity level of the battery pack. Advantageously, a difference between the estimated full capacity level and the actual full capacity level can be smaller than a difference between the rated full capacity level and the actual full capacity level if the cell voltages are unbalanced. Thus, the estimated full capacity level can be more accurate to reflect the actual full capacity level of the battery pack.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description

What is claimed is:

1. A battery gas gauge for energy efficient measuring of charge of a battery pack comprising a rechargeable multi-cell battery pack, comprising:
   a voltage detection unit coupled to said battery pack and operable for measuring a plurality of open circuit voltages of a plurality of cells in said battery pack respectively; and
   a processor coupled to said voltage detection unit and operable for determining a minimum open circuit voltage of said open circuit voltages, and for determining a first relative state of charge of said battery pack based on a relationship between said minimum open circuit voltage and a corresponding relative state of charge of a cell having said minimum open circuit voltage.

2. The battery gas gauge of claim 1, further comprising:
   a storage unit coupled to said processor and for storing a lookup table indicating said relationship.

3. The battery gas gauge of claim 1, wherein said processor is operable for determining a remaining capacity level of said battery pack based on said first relative state of charge and a rated full capacity level of said battery pack.

4. The battery gas gauge of claim 3, wherein said processor is operable for determining an average open circuit voltage of said cells, and for determining a second relative state of charge of said battery pack based on said average open circuit voltage, and for determining an estimated full capacity level of said battery pack based on said remaining capacity level and said second relative state of charge.

5. The battery gas gauge of claim 4, wherein said voltage detection unit is operable for dividing said remaining capacity level by said second relative state of charge to determine said estimated full capacity level.

6. The battery gas gauge of claim 4, wherein said processor is operable for determining a current remaining capacity level of said battery pack by adding charges accumulated in said battery pack during a charging process to said remaining capacity level, and is operable for determining a third relative state of charge of said battery pack by dividing said current remaining capacity level by said estimated full capacity level.

7. The battery gas gauge of claim 4, wherein said processor is operable for determining a current remaining capacity level of said battery pack by subtracting charges consumed by said battery pack during a discharging process from said remaining capacity level, and is operable for determining a third relative state of charge of said battery pack by dividing said current remaining capacity level by said estimated full capacity level.

8. An electronic system for energy efficient measuring of charge of a battery pack comprising a rechargeable multi-cell battery pack, comprising:
   a voltage detection unit coupled to a said battery pack and operable for measuring a plurality of open circuit voltages of a plurality of cells in said battery pack respectively;
   a processor coupled to said voltage detection unit and operable for determining a minimum open circuit voltage of said open circuit voltages, and for determining a first relative state of charge of said battery pack based on said minimum open circuit voltage and a predetermined lookup table; and
   a storage unit coupled to said processor and for storing said predetermined lookup table, wherein said predetermined lookup table stores different relative state of charges of said battery pack corresponding to different levels of said minimum open circuit voltage.

9. The electronic system of claim 8, wherein said processor is operable for determining a remaining capacity level of said battery pack based on said first relative state of charge and a rated full capacity level of said battery pack.

10. The electronic system of claim 9, wherein said processor is operable for determining an average open circuit voltage of said cells, and for determining a second relative state of charge of said battery pack based on said lookup table and said average open circuit voltage, and for determining an estimated full capacity level of said battery pack based on said remaining capacity level and said second relative state of charge.

11. The electronic system of claim 10, wherein said voltage detection unit is operable for dividing said remaining capacity level by said second relative state of charge to determine said estimated full capacity level.

12. The electronic system of claim 10, wherein said processor is operable for determining a current remaining capacity level of said battery pack by adding charges accumulated in said battery pack during a charging process to said remaining capacity level, and is operable for determining a third relative state of charge of said battery pack by dividing said current remaining capacity level by said estimated full capacity level.

13. The electronic system of claim 10, wherein said processor is operable for determining a current remaining capacity level of said battery pack by subtracting charges consumed by said battery pack during a discharging process from said remaining capacity level, and is operable for determining a third relative state of charge of said battery pack by dividing said current remaining capacity level by said estimated full capacity level.

14. A method for energy efficient determining a capacity level of a battery pack comprising a plurality of cells, said battery pack comprising a rechargeable multi-cell battery pack, said method comprising:
   measuring a plurality of open circuit voltages of said cells respectively;
   determining a minimum open circuit voltage of said open circuit voltages; and
   determining a first relative state of charge of said battery pack based on said minimum open circuit voltage and a predetermined lookup table,
   wherein said lookup table indicates a relationship between said minimum open circuit voltage and a corresponding relative state of charge of a cell having said minimum open circuit voltage.

15. The method of claim 14, further comprising:
   determining a remaining capacity level of said battery pack based on said first relative state of charge and a rated full capacity level of said battery pack.

16. The method of claim 15, further comprising:
   determining an average open circuit voltage of said cells;
   determining a second relative state of charge of said battery pack based on said lookup table and said average open circuit voltage; and
   determining an estimated full capacity level of said battery pack based on said remaining capacity level and said second relative state of charge.

17. The method of claim 16, further comprising:
   dividing said remaining capacity level of said battery pack by said second relative state of charge to determine said estimated full capacity level.

18. The method of claim 16, further comprising:
   determining a current remaining capacity level of said battery pack by adding charges accumulated in said battery pack during a charging process to said remaining capacity level; and
   determining a third relative state of charge of said battery pack by dividing said current remaining capacity level by said estimated full capacity level.

19. The method of claim 16, further comprising:
   determining a current remaining capacity level of said battery pack by subtracting charges consumed by said battery pack during a discharging process from said remaining capacity level; and
   determining a third relative state of charge of said battery pack by dividing said current remaining capacity level by said estimated full capacity level.

* * * * *